United States Patent
Renz

Patent Number: 5,936,453
Date of Patent: Aug. 10, 1999

[54] CIRCUIT ARRANGEMENT FOR CONTROLLING A PULSE OUTPUT STAGE

[75] Inventor: Norbert Renz, Bregenz, Austria

[73] Assignee: Leica Geosystems AG, Heerbrugg, Switzerland

[21] Appl. No.: 08/875,285

[22] PCT Filed: Nov. 21, 1996

[86] PCT No.: PCT/EP96/05129

§ 371 Date: Jul. 23, 1997

§ 102(e) Date: Jul. 23, 1997

[87] PCT Pub. No.: WO97/22181

PCT Pub. Date: Jun. 19, 1997

[30] Foreign Application Priority Data

Dec. 13, 1995 [DE] Germany .......................... 195 46 562

[51] Int. Cl.$^6$ .................................................. H03K 17/04
[52] U.S. Cl. ........................................... 327/375; 327/391
[58] Field of Search .................................. 327/375–377, 327/379, 383, 389, 391, 427, 430, 431, 432, 434, 437, 440

[56] References Cited

U.S. PATENT DOCUMENTS

| | | | |
|---|---|---|---|
| 3,740,581 | 6/1973 | Pfiffner | 327/432 |
| 4,902,921 | 2/1990 | Hiramoto et al. | 327/432 |
| 4,904,889 | 2/1990 | Chieli | 327/432 |
| 5,089,727 | 2/1992 | Molitor | 327/181 |
| 5,463,648 | 10/1995 | Gibbs | 372/38 |
| 5,576,648 | 11/1996 | Rossi et al. | 327/434 |

FOREIGN PATENT DOCUMENTS

| | | |
|---|---|---|
| 0 637 874 | 2/1995 | European Pat. Off. . |
| 33 01 648 | 7/1984 | Germany . |

OTHER PUBLICATIONS

Proceedings of the International Symposium on Power Semiconductor Devices and IC'S (ISPSD), Tokyo, May 19–21, 1992, Nr. Symp. 4, Institute of Electrical and Electronics Engineers, pp. 194–197, XP000340035 Kumagai N: "Gate Operation Circuit Configuration with a Power Supply for Mos–Gate Devices".

*Primary Examiner*—My-Trang Nutron
*Attorney, Agent, or Firm*—Foley & Lardner

[57] ABSTRACT

A specification is given of a circuit arrangement for controlling a pulse output stage, which comprises a MOS-FET power stage and a controller stage. The controller circuit (5) is connected to the drain of the MOS-FET (1) as the sole voltage supply, and the parameters of the circuit arrangement are designed such that the voltage drop across the drain of the MOS-FET (1) does not exceed the permissible voltage maximum at the gate of the MOSFET (1). The supply current flowing from the drain of the MOS-FET to the controller circuit preferably contributes to the load current.

4 Claims, 1 Drawing Sheet

CIRCUIT ARRANGEMENT FOR CONTROLLING A PULSE OUTPUT STAGE

BACKGROUND

The invention relates to a circuit arrangement for controlling a pulse output stage.

Output stages supply voltage pulses with a low internal resistance and make it possible, for example, to supply power to loads which are to be operated in a pulsed manner. Such loads may be, inter alia, pulsed diode lasers. Pulsed currents up to 100 A with pulse widths of a few ten nanoseconds are typically required here for diodes in the power range of a few ten watts peak power. Thyristors or MOS field-effect power transistors (MOS-FET) are frequently employed for such output stages, said MOS field-effect power transistors superseding the thyristors to an ever greater extent as a result of their low turn-on resistance.

A circuit arrangement for controlling a pulse output stage is disclosed in "Halbleiter Schaltungstechnik" [Semiconductor Circuitry], Springer-Verlag, 9 th edition, page 581 and, for the purpose of elucidation, is illustrated here in FIG. 3, using the example of an output stage controller of a diode laser. A MOS-FET 1 directly connects a diode laser (2) as the load to a capacitor (4), which has previously been charged to a suitably high voltage by a charging circuit (LS) 3, which is not explained in any detail. As a result, the capacitor (4) is discharged by a current pulse via the diode (2) and the MOS-FET (1), the voltage drops across the involved components and leads being divided depending on their impedance. A powerful controller (5), which supplies the large peak currents lying in the ampere range, is usually used. The disadvantage of this is that this controller both requires a dedicated voltage supply (SV) 6, which causes additional costs, and has its own power consumption, which is disadvantageous particularly in the case of small and light, portable devices, in particular also in the case of a low battery voltage. The dedicated voltage supply (6) of the controller is present because the permissible gate control voltage of commercially available MOS-FETs is at most 20 V, and then in output stages of this type is, as a rule, only a fraction of the voltage available at the charging circuit.

DE 33 01 648 A1 describes a power stage in which an input amplifier is connected upstream of the gate of a power FET. The control signal is applied to the input amplifier. The input amplifier comprises two FETs connected in parallel. The drain voltage of the power FET is present at the drain of one of the amplifier FETs. The gate of the power FET is connected to the source terminals of the amplifier FETs. The output voltage generated at the latter follows solely the control signal, and not the drain voltage. Since the drain and gate of the power FET are not connected directly via the control circuit, the gate is actively protected against a possibly excessively high drain voltage.

SUMMARY OF THE INVENTION

The object of the invention is to provide a circuit arrangement for controlling a pulse output stage of the type mentioned in the introduction, in which the disadvantages known from the prior art have been overcome.

This object is achieved by means of the features specified below.

According to the invention, the output stage can be supplied without additional auxiliary voltage for the controller, and also without directly drawing the power required therefor from a power source. This results, in a particularly advantageous manner, in a reduction in the costs and an increase in the electrical efficiency.

According to the invention, this is achieved by virtue of the fact that a suitable controller is supplied from the load-side end of the output stage. The precondition for this, however, is that the voltage drops across all the components involved in the flow of current through the output stage, including the wiring impedances, are divided in such a way that the voltage drop across the drain of the MOS-FET does not exceed the permissible voltage maximum at the gate of the MOS-FET, so that the latter is not destroyed; because it must be taken into account that the charging voltage of the pulse output stage is above the permissible voltage maximum of the gate. Such a voltage drop across the drain is produced, in conjunction with the desired large and brief pulsed currents, simply by the finite turn-on impedance of the MOS-FET, which will be able to be additionally influenced by a suitable selection of the components, circuit layout and charging voltage.

The voltage drop across the drain, which is harmful per se but unavoidable, is used to advantage according to the invention since, under the operating conditions already mentioned above, it is of an order of magnitude which would likewise have been necessary for a separate gate controller. The switch-on operation proceeds such that the gate is charged from the drain by means of the controller and the MOS-FET begins to switch on. The voltage at the gate now approximates the voltage drop across the drain and, at the same time, the gate is protected against the high charging voltage. In order to obtain a current pulse which is as large as possible, it should be ensured, in the manner which has likewise already been mentioned, by a suitable selection of the components, circuit layout and charging voltage, that the gate voltage becomes as high as possible, but the gate is nevertheless not actually damaged.

BRIEF DESCRIPTION OF THE DRAWINGS

The subject matter of the invention is described in more detail below using exemplary embodiments with reference to the drawings, in which FIG. 1 diagrammatically shows a first embodiment of the invention.

The same reference symbols are used for the same components throughout the figures.

DETAILED DESCRIPTION OF EXEMPLARY EMBODIMENTS

Figure 3:
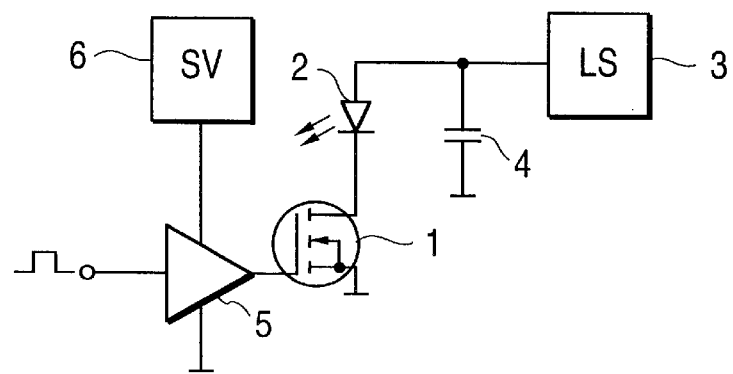
FIG. 3 shows a controller of a pulse output stage according to the prior art.

A first embodiment of a circuit arrangement of an output stage controller according to the invention is described with reference to FIG. 1. The circuit arrangement shown in FIG. 1 differs from that according to the prior art as shown in FIG. 3 by the fact that the voltage supply (6) has been omitted, and the electrical energy for the controller (5) is now supplied from the load-side end of the output stage. For this purpose, the drain of the MOS-FET (1) is connected to the controller (5).

As has already been described, for the purpose of obtaining a current pulse which is as large as possible, the gate voltage should be as high as possible, but without actually damaging the gate. The voltage drop across the drain can be utilized as the gate voltage supply, which voltage drop is produced, in conjunction with the desired, large and brief pulsed currents, simply by the finite turn-on impedance of the MOS-FET (1). This can be coordinated by means of a suitable selection of the components, of the circuit layout and of the charging voltage.

What is furthermore advantageous in this circuit arrangement is the fact that the current from the controller, which current is supplied to the gate, likewise flows through the load and not directly from a supply voltage, and thus contributes to the total flow of current through the load.

Figure 1:
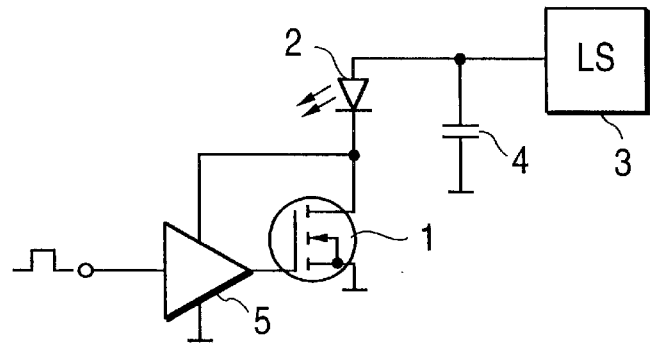
Figure 2:
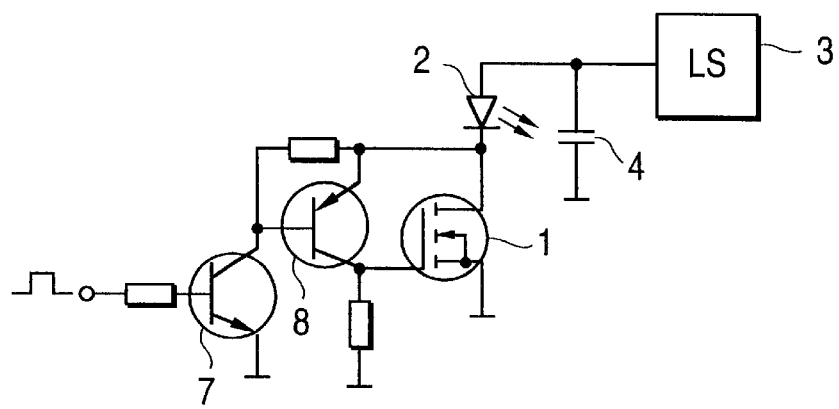
FIG. 2 shows the controller in the embodiment according to FIG. 1 in more detail.

A more detailed illustration of the controller 5 of the embodiment according to FIG. 1 is shown in FIG. 2, for example. It is evident that the controller comprises an NPN transistor 7 and a PNP transistor 8, which are connected directly in series and are coupled to the gate With the circuit arrangement shown in FIG. 2, peak currents of up to 100 A were achieved when using a low-power MOS-FET and a charging voltage of 50 V, and the gate voltage increased to 15 V.

I claim:

1. A circuit arrangement for controlling a pulsed output stage, comprising:

a MOS-FET power stage having a MOS-FET (1); and a controller circuit (5);

wherein the controller circuit (5) is connected to a drain of the MOS-FET (1) as the sole voltage supply and wherein the controller circuit (5) directly connects the drain of the MOS-FET (1) to a gate of the MOS-FET (1) in a conduction state such that the drain of the MOS-FET and the gate of the MOS-FET are at approximately the same voltage, and wherein circuit parameters in a load circuit are set such that a voltage drop across the drain of the MOS-FET (1) does not exceed a permissible voltage maximum at the gate of the MOS-FET (1), and wherein a supply current flowing from the drain of the MOS-FET (1) to the controller circuit (5) contributes to a load current.

2. A circuit arrangement as set forth in claim 1, comprising a diode laser coupled to the MOS-FET.

3. A circuit arrangement as set forth in claim 1, wherein the controller circuit (5) comprises an NPN transistor (7) and a PNP transistor (8).

4. A circuit arrangement as set forth in claim 2, wherein the controller circuit (5) comprises an NPN transistor (7) and a PNP transistor (8).

\* \* \* \* \*